United States Patent [19]

Masuda et al.

[11] 4,290,119
[45] Sep. 15, 1981

[54] MEMORY DEVICE PROTECTED AGAINST UNDESIRABLE SUPPLY VOLTAGE LEVEL

[75] Inventors: Kouji Masuda, Ohme; Masao Mizukami, Yokohama; Nobuaki Kitamura, Kodaira, all of Japan

[73] Assignees: Hitachi, Ltd.; Hitachi Ome Electronic Co., Ltd., both of Tokyo, Japan

[21] Appl. No.: 119,519

[22] Filed: Feb. 7, 1980

[30] Foreign Application Priority Data

Feb. 23, 1979 [JP] Japan .................................. 54/19775

[51] Int. Cl.³ ............................................. G11C 11/40
[52] U.S. Cl. ..................................... 365/189; 365/154; 365/229; 307/238.2
[58] Field of Search ................ 365/189, 229, 174, 154, 365/175, 193; 307/238

[56] References Cited

U.S. PATENT DOCUMENTS 4,085,311   4/1978   Ohasako et al. .................... 365/229
4,227,257  10/1980   Sato ...................................... 365/229

Primary Examiner—Terrell W. Fears
Attorney, Agent, or Firm—Craig and Antonelli

[57] ABSTRACT

A memory circuit includes memory cells and access circuit for accessing to desired memory cells. The access circuit is driven by a driver which includes an emitter coupled logic for providing a switch-on signal of a low level in response to an input signal. A switch circuit in the driver provides the access circuit with a drive signal of a low level in response to the switch on signal. The driver further includes a control circuit for clamping the output of the emitter coupled logic to a non-drive signal of a high level when supply voltages does not satisfy predetermined conditions.

9 Claims, 8 Drawing Figures

MEMORY DEVICE PROTECTED AGAINST UNDESIRABLE SUPPLY VOLTAGE LEVEL

BACKGROUND OF THE INVENTION

The present invention relates to a MOS memory device which includes a memory circuit composed of insulated gate type field effect transistors (MOSFET's) and a driver for driving the memory circuit, and more specifically to a memory device (N-MOS memory) having a memory circuit composed of N-channel insulated gate type field effect transistors (NMOSFET's) and a driver which is compensated against the fluctuation in power-supply voltage.

Conventional N-MOS memories consist, as shown in FIG. 1, of a memory circuit 100, and drivers 300 to 330 for driving the memory circuit. The memory circuit 100 has a plurality of memory chips 200 which are served with chip select signals $\overline{CS}$, row address strobe signals $\overline{RAS}$, column address strobe signals $\overline{CAS}$, and writing signals $\overline{WRITE}$, which are respectively supplied from the drivers 300 to 330 through common signal lines. To read the memory, address signals $A_1$ to $A_6$ are fed to each of the chips through common signal lines, whereby a data DATA OUT is read out from each of the chips. To write the memory, a data DATA IN is supplied to each of the chips 200 together with the address signals $A_1$ to $A_6$. A voltage $V_{CC}$ of a positive polarity, a voltage $V_{EE}$ of a negative polarity and a ground voltage $V_{SS}$ are supplied from predetermined power-supply terminals to the memory circuit 100; these voltages are supplied to each of the chips 200 via common power-supply lines (not shown).

Referring to FIG. 2, the memory circuit 100 consists of a clock signal generator circuit 6, which, upon receipt of the row address strobe signal $\overline{RAS}$, produces a row enabling clock signal for introducing row address information, a clock signal generator circuit 8 which produces a column enabling clock signal for introducing column address information upon receipt of the row address strobe signal $\overline{RAS}$ and column address strobe signal $\overline{CAS}$ through a gate circuit 7, a control circuit 9 which, upon receipt of clock signals from the clock signal generator circuits 6 and 8, controls an address buffer circuit 13 and an address decoder circuit 14 which enables 54 row lines and 32 column select lines, a buffer circuit 10 which receives the chip select signals $\overline{CS}$, a gate circuit 12 which, upon receipt of output signals from the clock signal generator circuit 8 and the buffer circuit 10, produces a column enabling signal to the address decoder circuit 14 and an enabling signal to a data output buffer circuit 17 which is reset by the $\overline{CAS}$ signal and produces a data DATA OUT when it is enabled, a gate circuit 11 which controls the operation of a write clock signal generator circuit 15 upon receipt of the write control signal $\overline{WRITE}$ and an output signal from the gate circuit 7, a data input buffer circuit 16 which receives a data DATA IN in response to an enabling signal provided by the write clock signal generator circuit 15, memory arrays 18 and 18', a preamplifier group 19, and an input/output data line selector circuit 20.

Signals $\overline{CS}$, $\overline{RAS}$, $\overline{CAS}$, $\overline{WRITE}$ and $A_1$ to $A_6$ are received by the memory circuit 100 through inverters 5. When the memory circuit 100 is not to be driven, the drive signals $\overline{CS}$, $\overline{RAS}$, $\overline{CAS}$ are in a high level, and when the memory circuit 100 is to be driven, the drive signals are in a low level. The reason is because, the operation of the memory circuit 100 can be quickly raised when the drive signals of such levels are used. Below is mentioned with regard to this point.

With reference to FIG. 3, the inverter circuit 5 consists of MOSFET's $Q_{24}$ to $Q_{28}$ and a capacitor $C_1$. MOSFET's $Q_{24}$ to $Q_{26}$ and capacitor $C_1$ constitute an inverter circuit, and MOSFET's $Q_{27}$ and $Q_{28}$ constitute a push-pull output circuit.

FIG. 4 illustrates waveforms A, B and C of an input signal fed to the inverter circuit, a source voltage of the MOSFET $Q_{25}$, and a gate voltage of the MOSFET $Q_{25}$. When the input signal A is of the high level, the MOSFET's $Q_{26}$ and $Q_{28}$ are rendered conductive, so that source voltage B of the MOSFET $Q_{25}$ as well as the source voltage of the MOSFET $Q_{27}$ acquire the low level which is approximately equal to the ground potential. In this case, the capacitor $C_1$ is electrically charged to acquire a value $V_{CC}-V_{th}$ which is equal to the power-supply voltage $V_{CC}$ minus a threshold voltage $V_{th}$ of the MOSFET $Q_{24}$ which is diode-connected.

When the input signal A is changed from the high level to the low level, the MOSFET's $Q_{26}$ and $Q_{28}$ are rendered non-conductive, so that source voltage B of the MOSFET $Q_{25}$ as well as the source voltage of the MOSFET $Q_{27}$ starts to rise. Here, since the capacitor $C_1$ has been electrically charged beforehand to a value close to $V_{CC}-V_{th}$, the gate voltage of MOSFET $Q_{25}$ becomes sufficiently great. As a result, the resistance of MOSFET $Q_{25}$ while it is conductive is sufficiently reduced. As the resistance of MOSFET $Q_{25}$ while it is conductive is sufficiently reduced, a stray capacity $C_2$ between the source of MOSFET $Q_{25}$ and the ground is quickly charged, so that a source voltage B of MOSFET $Q_{25}$ is raised at a high speed. Owing to the bootstrap effect of the capacitor $C_1$, the gate voltage C of MOSFET $Q_{25}$ rapidly rises responsive to the rise in the source voltage. As the gate voltage C becomes greater than the power-supply voltage $V_{CC}$, the source voltage B of MOSFET $Q_{25}$ rises to a value close to the power-supply voltage $V_{CC}$ regardless of the threshold voltage possessed by the MOSFET $Q_{25}$. The output signal supplied from the source of MOSFET $Q_{27}$ also rises quickly with the rise in the source voltage B of MOSFET $Q_{25}$. Accordingly, various elements in the memory circuit 100 rise quickly responsive to the output of the inverter circuit 5. However, if a signal which rises from the low level to the high level is used to drive the memory circuit, the rise of the memory circuit 100 will become sluggish. In order for the memory circuit 100 to be driven by a signal which rises from the low level to the high level, the memory circuit must be provided with two stages of inverter circuits. Therefore, the operation speed of the memory circuit becomes sluggish as compared with the case when one stage of inverter circuit is employed. Because of the above-mentioned reasons, with the conventional memory devices, the memory circuit 100 is so constructed as to receive a driving signal which acquires the high level during the period of non-operation and the low level during the period of operation such that the operation speed can be increased, and the drivers are so constructed as to produce such driving signals.

With the conventional memory devices, however, if the circuits of power supplies $V_{CC}$ and $V_{EE}$ are closed in an incorrect sequence, overcurrents will flow into the drivers 300 to 330.

For example, when the predetermined voltage $V_{CC}$ of positive polarity is supplied to the memory device without supplying the voltage $V_{EE}$ of negative polarity, the drivers 300 to 330 will permit excess of currents to flow therethrough so that driving signals of the high level are produced. When such a state is sustained, however, transistors for producing driving signals in the drivers will be broken down. In order to preclude such inconvenience, the conventional class-1 memory devices are equipped with a breaker (not shown) in the power-supply circuit to interrupt the power supply when overcurrents start to flow, and the conventional class-2 memory devices are equipped with a sequencer (not shown) to define the order of closing the power-supply circuits. With the former memory devices, however, the circuits of power supplies must be closed again after they have been interrupted by the breaker. With the latter memory devices employing a sequencer, on the other hand, the manufacturing costs are increased.

Further, the phenomenon of overcurrents which flow when the power-supply voltages are not proper, takes place when the power-supply voltages are varied after the power supplies have been connected.

The power-supply voltage fluctuates even when a constant voltage is supplied to the memory device from an external unit. For example, when the drivers 300 to 330 are constructed in the form of a monolithic device by the technique of integrated circuit, the power-supply voltages practically supplied to each of the drivers undergo fluctuation depending upon the operation conditions of various circuits included in the monolithic device.

With the conventional class-1 memory devices, if the fluctuation in power-supply voltages exceeds a limit value, the power supplies are interrupted even when the fluctuation develops temperarily, resulting in the interruption of operation of the memory devices. Furthermore, with the conventional class-2 memory devices, it is difficult to prevent the drivers from being broken down by overcurrents. According to the conventional memory devices, therefore, it is necessary to employ a sequencer for assuring the order of closing the power-supply circuits as well as a breaker for preventing the drivers from being broken down after the power supplies have been connected. This means that increased costs are required for manufacturing the memory devices.

SUMMARY OF THE INVENTION

The object of the present invention is to provide a memory device having a memory circuit which operates at high speeds and a driver which is insensitive to the order of closing the power supplies.

Another object of the present invention is to provide a memory device having a memory circuit which operates at high speeds and a driver which is insensitive to the fluctuation in the power-supply voltages.

A further object of the present invention is to provide a memory device which is capable of reliably starting the operation without the need of sequencer which assures the order of closing the power supplies.

Still further object of the present invention is to provide a memory device which is capable of protecting the drivers from being damaged without the need of breaker which interrupts the power supplies in response to overcurrents.

The memory device according to the present invention comprises a plurality of memory cells, a memory circuit having access means which makes access to the memory cells, and a driver for driving the access means, wherein the driver has an emitter-coupled logic which produces a switch-on signal and a switch-off signal in response to the input signals, a switching circuit which produces a drive signal of a low level and a non-drive signal of a high level in response to the switch-on signal and the switch-off signal, and a control circuit for clamping the output of the emitter-coupled logic. In particular, the control circuit is so constructed that the output of the emitter-coupled logic is clamped to the non-drive signal of the high level when the power-supply voltages fall outside a predetermined range.

DESCRIPTION OF THE PREFERRED EMBODIMENT

Figure 1:
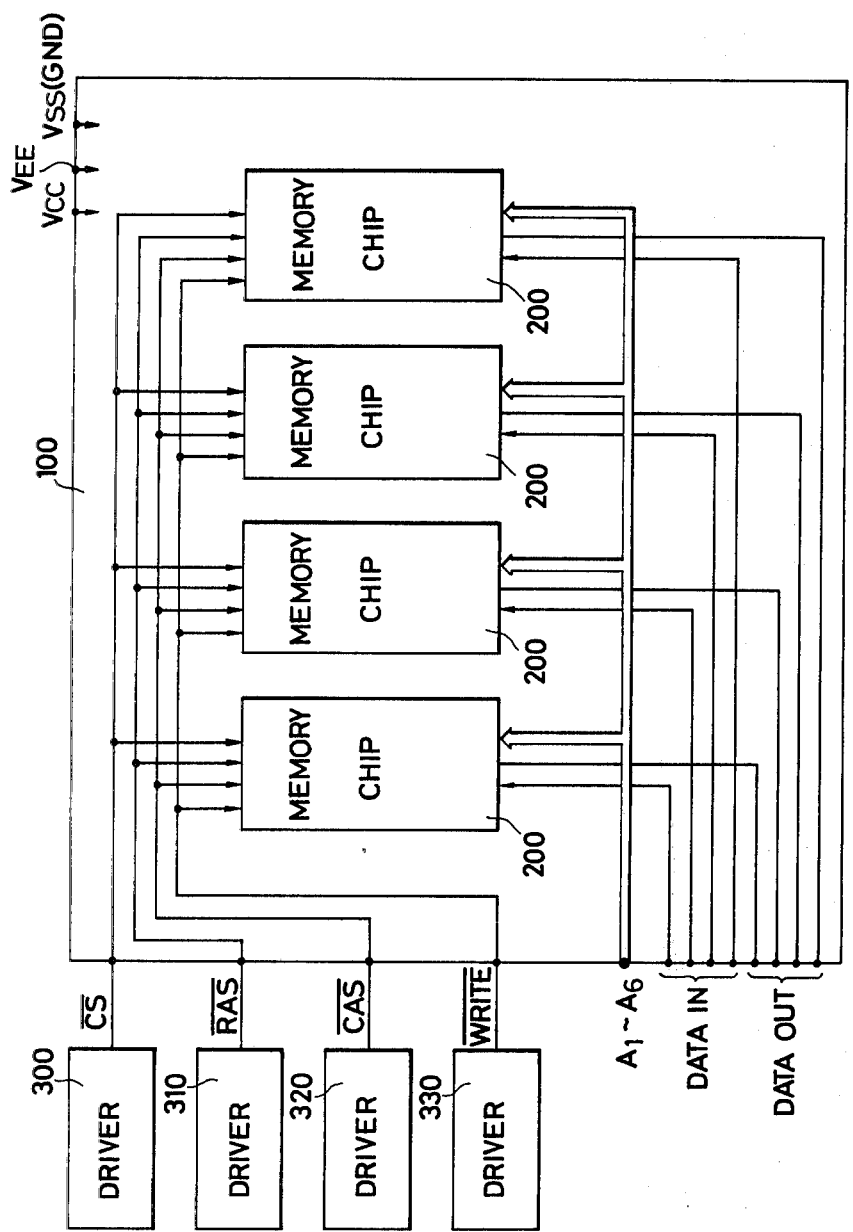
FIG. 1 is a block diagram schematically illustrating a memory device according to prior art.
Figure 2:
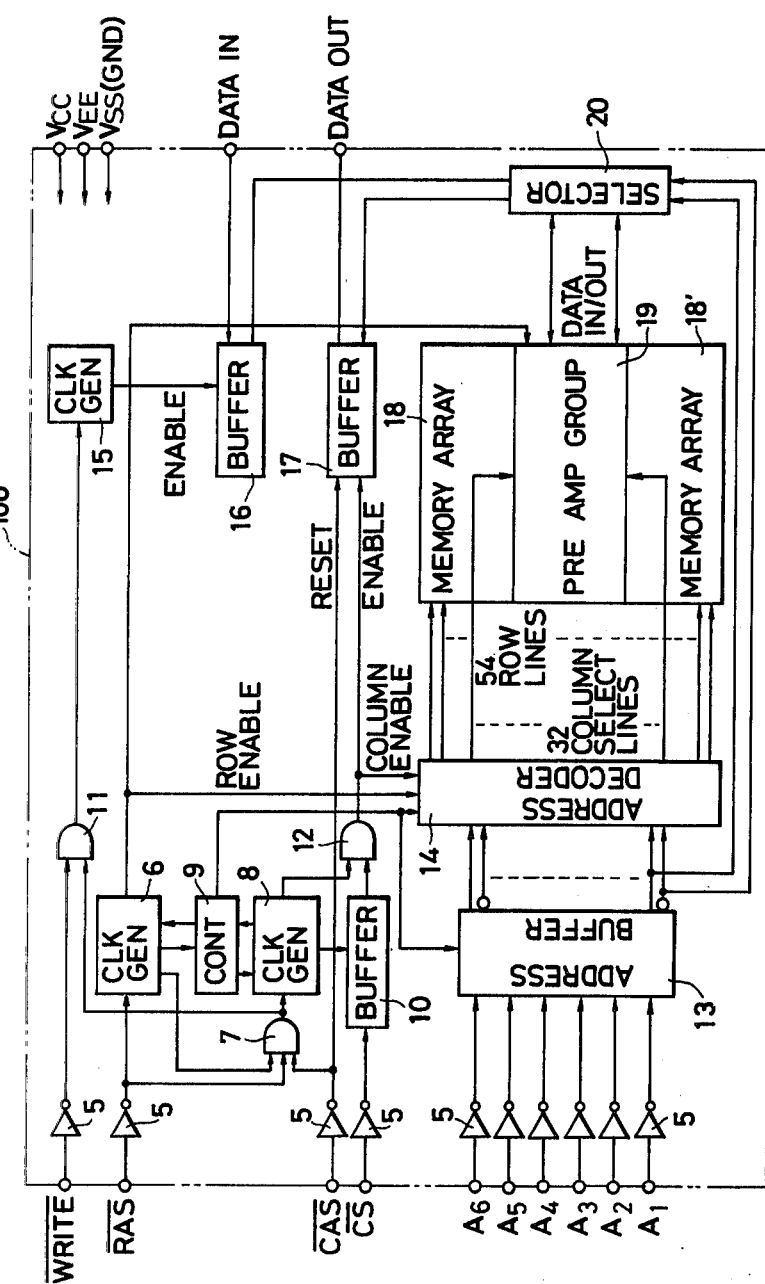
FIG. 2 is a block diagram schematically illustrating the memory circuit of FIG. 1.
Figure 3:
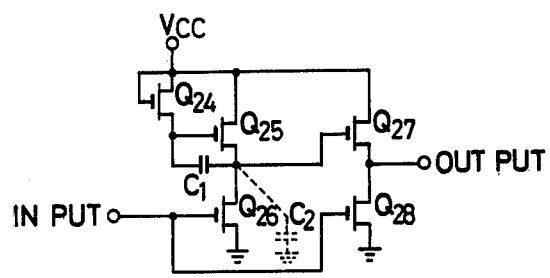
FIG. 3 is a diagram illustrating a logic circuit of an inverter of FIG. 2.
Figure 5:
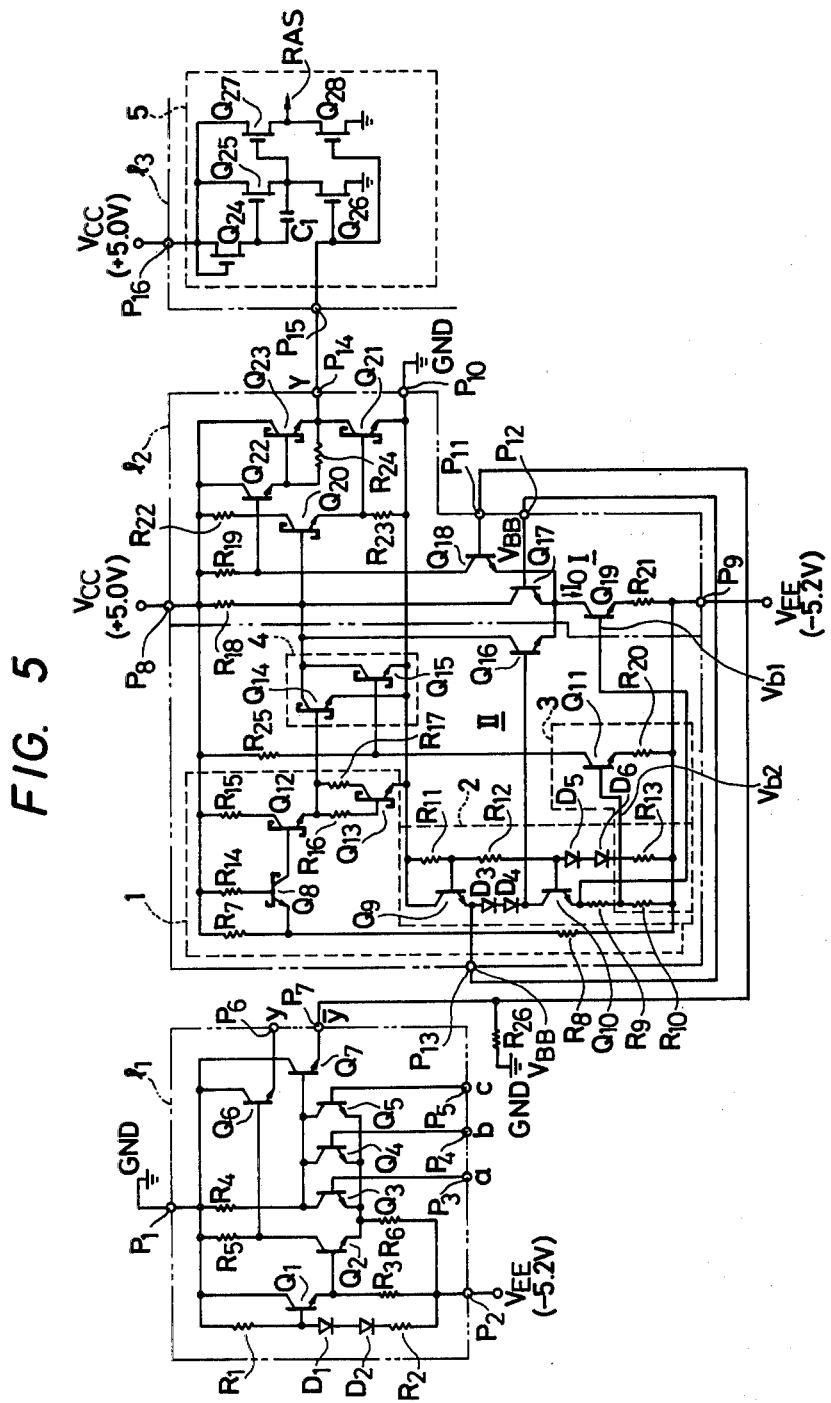
FIG. 5 is a diagram illustrating logic circuits of a memory device according to the present invention.

FIG. 5 shows a driver $l_2$ and a memory chip $l_3$ according to the present invention. The memory chip $l_3$ consists of a conventional circuit connection as shown in FIG. 2. For the purpose of simplicity, therefore, FIG. 5 illustrates only one inverter circuit 5 in the memory chip. The driver $l_2$ of FIG. 5 represents any one of the drivers 300 to 320 of FIG. 1. FIG. 5 further illustrates an emitter-coupled logic circuit (ECL circuit) $l_1$ which works to control the driver $l_2$.

Among the transistors in the driver $l_2$, transistors $Q_8$, $Q_{12}$, $Q_{13}$, $Q_{14}$, $Q_{15}$, $Q_{20}$ and $Q_{21}$ are bipolar transistors having a Schottky diode (not shown) connected between their individual collectors and bases. Other transistors in the driver $l_2$ and all of the transistors in the ECL circuit $l_1$ are bipolar transistors without having Schottky diodes. In FIG. 5, the transistors having Schottky diodes and the transistors without having Schottky diode are represented by different symbols of transistor.

The ECL circuit $l_1$ in FIG. 5 consists of a biasing circuit made up of resistors $R_1$ to $R_3$, diodes $D_1$ and $D_2$ and a transistor $Q_1$, and a logic circuit made up of resistors $R_4$ to $R_6$, and transistors $Q_2$ to $Q_7$.

Input signals a to c are fed to the bases of the transistors $Q_3$ to $Q_5$ from the terminals $P_3$ to $P_5$. Signals y and $\bar{y}$ of OR logic and NOR logic operations of the signals a to c are fed to output terminals $P_6$ and $P_7$ which are connected to the emitters of the transistors $Q_6$ and $Q_7$.

One power-supply terminal $P_1$ of the ECL circuit $l_1$ is connected to a ground point GND of the circuit, and another power-supply terminal $P_2$ is connected to a power-supply voltage $V_{EE}$ of a negative polarity of, for example, $-5.2$ V. The input signals and output signals of the ECL circuit $l_1$ will acquire a voltage of $-0.89$ V when they are in a high level, and $-1.69$ V when they are in a low level.

The MOS memory drive circuit $l_2$ according to the present invention have a first circuit I made up of transistors $Q_{17}$ to $Q_{23}$, and resistors $R_{18}$, $R_{19}$, $R_{21}$ to $R_{24}$, a second circuit II made up of transistors $Q_8$, $Q_{11}$ to $Q_{16}$ and resistors $R_7$, $R_8$, $R_{14}$ to $R_{17}$, $R_{20}$, $R_{25}$, and a constant-voltage biasing circuit 2 made up of transistors $Q_9$, $Q_{10}$, diodes $D_3$ to $D_6$, and resistors $R_9$ to $R_{13}$. The MOS memory drive circuit $l_2$ is formed on a single semiconductor substrate by the technique of monolithic semiconductor integrated circuits.

One power-supply terminal $P_8$ of the MOS memory drive circuit $l_2$ is connected to a power-supply voltage $V_{CC}$ of positive polarity of, for example, 5 V, and another power-supply terminal $P_9$ is connected to the power-supply voltage $V_{EE}$ of negative polarity which is the same as provided to the terminal $P_2$ of the ECL circuit $l_1$, and remaining power-supply terminal $P_{10}$ is connected to the ground point GND of the circuit.

Although there is no particular limitation, the constant-voltage biasing circuit 2 is interposed between the ground point GND and the power-supply terminal $V_{EE}$ of negative polarity. The circuit 2 supplies a biasing voltage $V_{BB}$ of, for example, $-1.29$ V which is of an intermediate level between the two ECL signals of the high level and the low level, to a terminal $P_{13}$ which is connected to a connection point of the emitter of transistor $Q_9$ and the anode of diode $D_3$, and produces a biasing voltage which is smaller than the ECL signal of the low level from a connection point of the anode of diode $D_4$ and the collector of transistor $Q_{10}$. Further, a biasing voltage $V_{b1}$ for energizing the transistor $Q_{19}$ is produced from a connection point of the emitter of transistor $Q_{10}$ and the resistor $R_9$, and a biasing voltage $V_{b2}$ for energizing the transistor $Q_{11}$ is produced from a connection point of the resistor $R_9$ and the resistor $R_{10}$.

In the first circuit I, the transistor $Q_{19}$ and resistor $R_{21}$ constitute a constant-current source, and transistors $Q_{17}$ and $Q_{18}$ constitute a pair of differential transistors.

The constant-voltage biasing circuit 2 feeds a biasing voltage $V_{BB}$ to the base of the transistor $Q_{17}$ through terminals $P_{13}$ and $P_{12}$, and the ECL circuit $l_1$ feeds an output signal $\bar{y}$ to the transistor $Q_{18}$ through terminals $P_7$ and $P_{11}$. Therefore, when the output signal $\bar{y}$ of the ECL circuit $l_1$ is of the high level, the transistor $Q_{17}$ is in a non-conductive state and the transistor $Q_{18}$ is in a conductive state. Conversely, when the output signal $\bar{y}$ of the ECL circuit $l_1$ is in the low level, the states of the transistors $Q_{17}$ and $Q_{18}$ are reversed.

Depending upon which one of the transistor $Q_{17}$ or $Q_{18}$ is in a conductive state, a constant current of the constant-current transistor $Q_{19}$ is allowed to flow through the resistor $R_{18}$ or $R_{19}$, producing a voltage drop across the resistor $R_{18}$ or $R_{19}$. As a result, signals of opposite phases are fed to the collectors of the transistors $Q_{17}$ and $Q_{18}$ responsive to the levels of the signal from the ECL circuit $l_1$. In this case, by suitably setting the resistances of the resistors $R_{18}$ and $R_{19}$, the low level of output signals produced from the collectors of the transistors $Q_{17}$ and $Q_{18}$ can be nearly set to a ground potential, or, for example, to $+0.3$ V.

The collector outputs of the transistors $Q_{17}$ and $Q_{18}$ are supplied to the bases of output transistors $Q_{21}$ and $Q_{23}$ which are connected in cascade, via emitter-follower transistors $Q_{20}$ and $Q_{22}$. The output transistors $Q_{21}$ and $Q_{23}$ are actuated in reverse phase relative to each other by the collector output of the pair of differential transistors $Q_{17}$ and $Q_{18}$. As a result, the output terminal $P_{14}$ which is connected to the collector of the transistor $Q_{21}$ and to the emitter of the transistor $Q_{23}$ produces an output signal Y which is converted to a voltage system of positive polarity responsive to the input signals from the ECL circuit $l_1$, and which is capable of sufficiently driving even a heavy load such as capacitive load.

According to this embodiment, the second circuit II in the MOS memory driver $l_2$ includes, as surrounded by a broken line, a circuit 1 (hereinafter referred to as $V_{CC} \cdot V_{EE}$ detector circuit) which detects a positive power-supply voltage $V_{CC}$ and a negative power-supply voltage $V_{EE}$, a circuit 3 (hereinafter referred to as $V_{EE}$ detector circuit) which detects the negative power-supply voltage $V_{EE}$, and a switching circuit 4.

Immediately after the power-supply circuits (not shown) have been closed to provide the power-supply voltages $V_{CC}$ and $V_{EE}$, a given period of time will be necessary before these voltages rise to their predetermined stationary values. Depending upon the characteristics of the power-supply circuits, therefore, it occurs that the absolute value of the negative power-supply voltage $V_{EE}$ does not reach its stationary level even after the positive power-supply voltage $V_{CC}$ has reached its stationary level. Further, even after the power-supply voltages $V_{CC}$ and $V_{EE}$ have reached the stationary values, the absolute value of the negative power-supply voltage $V_{EE}$ may often become abnormally small due to the fluctuation in power-supply voltage. The $V_{EE}$ detector circuit 3 works to protect the driver $l_2$ from being broken down when the absolute value of the negative power-supply voltage $V_{EE}$ is abnormally decreased below the stationary value and the positive power-supply voltage $V_{CC}$ is maintained at its predetermined stationary value.

When the absolute value of the negative power-supply voltage $V_{EE}$ is smaller than a critical value $V_{EE}$ (crit), substantially no biasing current flows through a current path consisting of transistor $Q_9$, diodes $D_3$ and $D_4$, transistor $Q_{10}$ and resistors $R_9$ and $R_{10}$ which are connected in series in the constant-current biasing circuit 2. Accordingly, the biasing voltage $V_{b1}$ produced from the emitter of the transistor $Q_{10}$ becomes substantially zero, and the constant-current transistor $Q_{19}$ is rendered non-conductive.

As the absolute value of the negative power-supply voltage $V_{EE}$ exceeds the critical value $V_{EE}$ (crit), the biasing voltage $V_{b1}$ produced by the emitter of the transistor $Q_{10}$ has a positive polarity, so that the constant-current transistor $Q_{19}$ is rendered conductive.

The non-conductive state of the constant-current transistor $Q_{19}$ causes the pair of differential transistors $Q_{17}$ and $Q_{18}$ to acquire the non-conductive state.

When the $V_{EE}$ detector circuit 3 and the switching transistor $Q_{15}$ in the switching circuit 4 have not been provided, the collector outputs of the pair of differential transistors $Q_{17}$ and $Q_{18}$ simultaneously acquire the high level when they are rendered non-conductive, so that the emitter-follower transistors $Q_{20}$, $Q_{22}$ in the push-pull output circuit and the output transistors $Q_{23}$, $Q_{21}$ in the MOS memory drive circuit $l_2$ are all rendered conductive. Consequently, an overcurrent flows from the voltage source $V_{CC}$ to the ground potential GND through the output transistors $Q_{23}$ and $Q_{21}$ so that these transistors are broken down.

According to the conventional art, it was necessary to provide a sequencer for controlling a sequence of closing the power-supply circuits to prevent the above-mentioned defect when the power-supply circuits are being closed, and to provide a breaker in the power-supply circuits to prevent the defect after the power-supply circuits have been closed.

Further, when both of the output transistors $Q_{23}$ and $Q_{21}$ are rendered conductive, a signal Y of the low level is provided from the terminal $P_{14}$ and the memory chip $l_3$ is energized. If the above-mentioned condition develops after the power-supply circuits have been closed, the memory chip $l_3$ erroneously operate. The conventional technique could not eliminate the erroneous operation.

According to the present invention equipped with the $V_{EE}$ detector circuit 3 and the switching circuit 4, on the other hand, the base of the detector transistor $Q_{11}$ in the $V_{EE}$ detector circuit 3 has been connected to a connection point of the resistor $R_9$ and the resistor $R_{10}$, so that the base of the transistor $Q_{11}$ is served with a biasing voltage $V_{b2}$ having absolute value which is smaller than that of the biasing voltage $V_{b1}$ that is obtained from the emitter of the transistor $Q_{10}$. Accordingly, so far as the absolute value of the negative power-supply voltage $V_{EE}$ acquires a predetermined value $V'_{EE}$(crit) which is greater than the aforementioned critical value $V_{EE}$ (crit) but is smaller than the stationary value of $V_{EE}$, the transistor $Q_{11}$ of the $V_{EE}$ detector circuit 3 is rendered non-conductive. In other words, when the absolute value of the negative power-supply voltage $V_{EE}$ is smaller than $V'_{EE}$ (crit) but is greater than $V_{EE}$ (crit), the transistor $Q_{11}$ is rendered non-conductive and the transistor $Q_{19}$ is rendered conductive, and when the $V_{EE}$ is smaller than $V_{EE}$ (crit), the transistors $Q_{11}$ and $Q_{19}$ are rendered non-conductive. The collector output of the transistor $Q_{11}$ which has been rendered non-conductive, is clamped to the high level (positive power-supply voltage $V_{CC}$), and the transistor $Q_{15}$ whose base is connected to the collector of the transistor $Q_{11}$ and whose emitter is connected to the ground voltage GND in the switching circuit 4 is rendered conductive. Since the collector of the transistor $Q_{15}$ has been connected to the base of the emitter-follower transistor $Q_{20}$ in the push-pull output circuit, the emitter-follower transistor $Q_{20}$ and the output transistor $Q_{21}$ whose base is connected to the emitter of transistor $Q_{20}$ are rendered non-conductive depending upon the conductive state of the transistor $Q_{15}$. Depending upon the non-conductive state of the output transistor $Q_{21}$, the emitter-follower transistor $Q_{22}$ and the output transistor $Q_{23}$ are rendered conductive, whereby an output signal Y of the high level is provided on the output terminal $P_{14}$.

Figure 6:
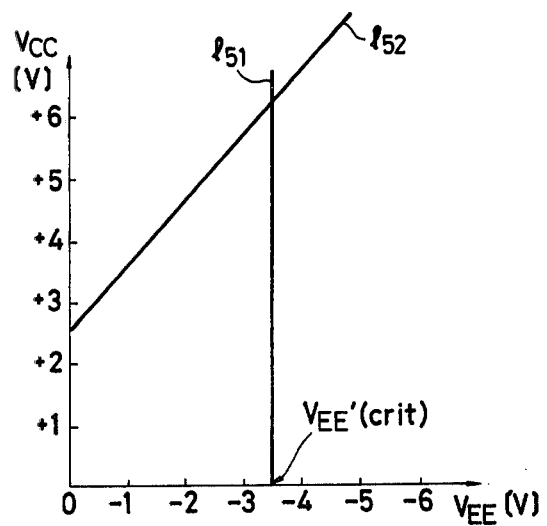
FIG. 6 is a diagram for explaining the operation of the circuit of FIG. 5.

That is, when the negative power-supply voltage $V_{EE}$ lies on the left side of a straight line $l_{s1}$ of FIG. 6 which represents an equality $V_{EE} = V'_{EE}$ (crit) at the moment when the power-supply circuits are being closed, and when the negative power-supply voltage $V_{EE}$ moves from the right side to the left side of the straight line $l_{s1}$ after the power-supply circuits are closed, the $V_{EE}$ detector circuit 3 and the switching circuit 4 forcibly cause the output signal Y of the output terminal $P_{14}$ to acquire the high level. The forcible operation of the $V_{EE}$ detector circuit 3 and the switching circuit 4 can be achieved so far as the positive power-supply voltage $V_{CC}$ possesses a minimum value which permits a base current to flow into the base of the transistor $Q_{15}$ in the switching circuit 4 via resistor $R_{25}$ so that the transistor $Q_{15}$ is rendered conductive.

As mentioned above, the output transistors $Q_{21}$ and $Q_{23}$ can be protected from being broken down when the power-supply circuits are being closed, without using a sequencer for closing the power-supply circuits. Even after the power-supply circuits have been closed, the output transistors $Q_{21}$ and $Q_{23}$ can be protected from being broken down without the need of employing a breaker, even if the negative power-supply voltage $V_{EE}$ is excessively varied. It is further possible to prevent the memory chip $l_3$ from being erroneously operated when it is energized under the condition in which the negative power-supply voltage $V_{EE}$ is excessively varied from its stationary level after the power-supply circuits have been closed.

On the other hand, when voltages of suitable values are applied to the positive power-supply voltage $V_{CC}$ and to the negative power-supply voltage $V_{EE}$, and the output signal $\bar{y}$ of the ECL circuit $l_1$ is of the low level, the transistor $Q_{17}$ of the pair of differential transistors $Q_{17}$ and $Q_{18}$ is rendered conductive such that its collector output acquires the low level, and the other transistor $Q_{18}$ is rendered non-conductive. In this case, the transistors $Q_{20}$ and $Q_{21}$ of the push-pull output circuit are rendered non-conductive by the collector output of low level produced by the transistor $Q_{17}$, and the transistors $Q_{22}$ and $Q_{23}$ of the push-pull output circuit are rendered conductive by the collector output of high level produced by the transistor $Q_{18}$.

However, even when the transistor $Q_{18}$ is non-conductive and the transistor $Q_{17}$ is conductive with the output signal $\bar{y}$ of the ECL circuit $l_1$ being of the low level, the collector output of low level produced by the transistor $Q_{17}$ may vary depending upon the positive power-supply voltage $V_{CC}$ or the negative power-supply voltage $V_{EE}$. Therefore, both of the output transistors $Q_{21}$ and $Q_{23}$ may often become conductive due to such undesirable voltages.

Namely, when the $V_{CC} \cdot V_{EE}$ detector circuit 1 and the switching circuit 4 are not provided, the voltage level of the collector output of low level produced by the transistor $Q_{17}$ which is in the conductive state will become $(V_{CC} - R_{18} \cdot I_O)$ where a constant current flowing into the constant-current transistor $Q_{19}$ is denoted by $I_O$, and a resistance of the resistor $R_{18}$ is denoted by $R_{18}$. Therefore, when the absolute value of the positive power-supply voltage $V_{CC}$ becomes excessively great or when the constant current $I_O$ becomes excessively small, the collector output of the transistor $Q_{17}$ changes from the low level into the high level. The constant current $I_O$ which flows through the constant-current transistor $Q_{19}$ becomes very small with the excessive reduction in the absolute value of the negative power-supply voltage $V_{EE}$. Therefore, when the collector voltage of low level of the transistor $Q_{17}$ represented by $(V_{CC} - R_{18} \cdot I_O)$ is changed into the high level due to excessively great positive power-supply voltage $V_{CC}$ or due to very small negative power-supply voltage $V_{EE}$, the transistors $Q_{20}$, $Q_{21}$ of the output push-pull circuit are rendered conductive. In this case, another transistor $Q_{18}$ of the pair of differential transistors is in the non-conductive state, and the transistors $Q_{22}$, $Q_{23}$ of the output push-pull circuit are already in the conductive state. Therefore, both of the output transistors $Q_{23}$, $Q_{21}$ are rendered conductive and are exposed to the danger of being broken down by a current which flows therethrough. Furthermore, the conductive state of the output transistor $Q_{21}$ gives rise to the development of undesired output signal Y of low level on the output terminal $P_{14}$.

Figure 4:
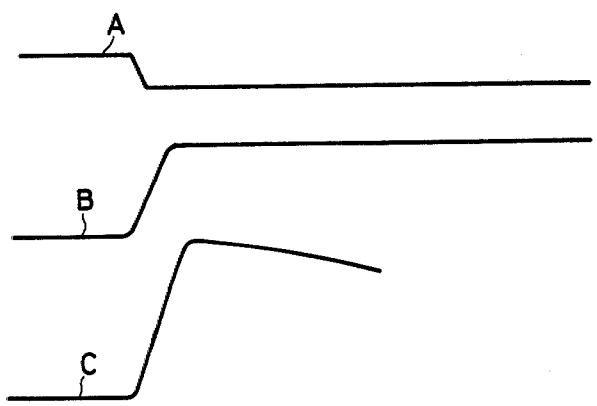
FIG. 4, consisting of A–C, is a time chart of signals related to the circuit of FIG. 3.

When the positive power-supply voltage $V_{CC}$ and the negative power-supply voltge $V_{EE}$ are not properly controlled as mentioned above, the phenomenon in which both the transistors $Q_{21}$ and $Q_{23}$ are rendered conductive, takes place not only when the power-supply circuits are being closed but even after the power-supply circuits have been closed. In some cases, the negative power-supply voltage $V_{EE}$ reaches a value which lies in a region on the right side of the straight line $l_{51}$ of FIG. 4 at the moment when the power-supply circuits are being closed, and the positive power-supply voltage $V_{CC}$ may acquire a great value temporarily. In that event, the collector voltage of the constant-current transistor $Q_{19}$ is maintained in the high level because of the same reasons as mentioned in the foregoing, such that the transistors $Q_{21}$ and $Q_{23}$ are both rendered conductive. Even after the power-supply circuits have been closed, the same phenomenon will take place if the positive power-supply voltage $V_{CC}$ and the negative power-supply voltage $V_{EE}$ undergo excessive changes. Thus, the transistors $Q_{21}$ and $Q_{23}$ will be broken down if both of them are rendered conductive. The conventional technique therefore depends upon a sequencer for closing the power-supply circuits in order to prevent the occurrence of the above-mentioned condition when the power-supply circuits are being closed, as well as upon a breaker which is provided in the power supply circuits to prevent the occurrence of the above-mentioned condition after the power-supply circuits have been closed.

According to the embodiment of the present invention, on the other hand, the $V_{CC} \cdot V_{EE}$ detector circuit 1 and the switching circuit 4 are provided. In particular, the $V_{CC} \cdot V_{EE}$ detector circuit 1 has a detector transistor $Q_8$ whose base is connected to the positive power-supply voltage $V_{CC}$ through a resistor $R_{14}$, whose emitter is connected to a connection point of two resistors $R_7$ and $R_8$ which are connected in series between the positive power-supply voltage $V_{CC}$ and the negative power-supply voltage $V_{EE}$, and whose collector is connected to the base of the emitter-follower transistor $Q_{12}$. The emitter of the transistor $Q_{12}$ is connected to a circuit network consisting of resistors $R_{16}$, $R_{17}$ and a transistor $Q_{13}$, and is further connected to the base of a switching transistor $Q_{14}$.

The emitter voltage of the transistor $Q_8$ is given by a primary function of positive power-supply voltage $V_{CC}$ and negative power-supply voltage $V_{EE}$. When the positive power-supply voltage $V_{CC}$ and the negative power-supply voltage $V_{EE}$ have normal values, a voltage is fed to the emitter of the transistor $Q_8$ so that a path across the base and emitter of the transistor $Q_8$ is rendered conductive. Accordingly, the transistor $Q_{12}$ is rendered non-conductive since it is served with no base current. With the transistor $Q_{12}$ being non-conductive, the transistor $Q_{14}$ is maintained in the non-conductive state since it is not served with the base current.

Therefore, when the absolute value of the positive power-supply voltage $V_{CC}$ is too great or when the absolute value of the negative power-supply voltage $V_{EE}$ is too small, the emitter voltage of the detector transistor $Q_8$ rises in excess of a predetermined positive reference value so that the path across the base and emitter of transistor $Q_8$ is rendered non-conductive. Accordingly, a sufficient base current is supplied to the emitter-follower transistor $Q_{12}$ via Schottky diode which is connected across the collector and base of the transistor $Q_8$; the transistor $Q_{12}$ is rendered conductive. Consequently, the switching transistor $Q_{14}$ is rendered conductive. Like the switching transistor $Q_{15}$, the transistor $Q_{14}$ which is rendered conductive causes the collector voltage of the transistor $Q_{17}$ to be clamped to 0 volt and the transistor $Q_{20}$ to be non-conductive. Therefore, the output transistor $Q_{21}$ is rendered non-conductive to protect the transistors $Q_{21}$, $Q_{23}$ from being broken down, and the output signal Y of the high level is produced from the output terminal $P_{14}$.

As will be understood from the foregoing description, a minimum value of positive power-supply voltage $V_{CC}$ which causes the transistor $Q_8$ to be non-conductive and the transistors $Q_{12}$, $Q_{14}$ to be conductive with respect to a given negative power-supply voltage $V_{EE}$, linearly increases with the increase in the absolute value of the negative power-supply voltage $V_{EE}$. The straight line $l_{52}$ of FIG. 6 represents a boundary between an upper region in which the transistor $Q_8$ becomes non-conductive and the transistors $Q_{12}$, $Q_{14}$ become conductive and a lower region in which the conductive states of such transistors are reversed.

When, after the power-supply circuits have been closed, the absolute value of the positive power-supply voltage $V_{CC}$ rises from the lower region beneath the line $l_{52}$ to the upper region above the line $l_{52}$, or the absolute value of the negative power-supply voltage $V_{EE}$ decreases from the lower region beneath the line $l_{52}$ to the upper region above the line $l_{52}$, and an operation point determined by the positive power-supply voltage $V_{CC}$ and the negative power-supply voltage $V_{EE}$ exceeds the line $l_{52}$ from the lower region to the upper region, the $V_{CC} \cdot V_{EE}$ detector circuit 1 and the switching circuit 4 maintain the transistors $Q_{20}$ and $Q_{21}$ of the output push-pull circuit in the non-conductive state to protect them from being broken down. Even when the positive power-supply voltage $V_{CC}$ temporarily exceeds the line $l_{52}$ toward the upper region at the moment when the power-supply circuits are being closed, the transistors $Q_{20}$ and $Q_{21}$ are rendered non-conductive and are protected from being broken down.

To protect the transistors $Q_{20}$, $Q_{21}$ from being broken down by the change in power-supply voltages $V_{CC}$ and $V_{EE}$, the following must be maintained. Namely, when the power-supply voltages $V_{CC}$ and $V_{EE}$ are varied with the transistor $Q_{17}$ being conductive, the transistor $Q_8$ must be rendered conductive and the transistors $Q_{12}$, $Q_{14}$ must also be rendered conductive before the collector voltage of the transistor $Q_{17}$ increases to a value which is sufficient to render the transistors $Q_{20}$, $Q_{21}$ conductive.

Whether the transistors $Q_8$, $Q_{12}$ and $Q_{14}$ are rendered conductive or not depends not only upon the power-supply voltages $V_{CC}$ and $V_{EE}$ but also upon voltage drops through resistors $R_7$, $R_8$, forward voltage drops $V_{BE}$ across the base and emitter of these transistors, and a forward voltage drop $V_{FS}$ of a Schottky diode connected across the base and collector of the transistor $Q_8$. It is therefore necessary to suitably select such parameters to attain the above-mentioned objects.

Here, the transistor $Q_{16}$ is used to forcibly cause the signal produced on the output terminal $P_{14}$ to acquire the high level, when the terminals $P_{11}$, $P_{12}$ are unexpectedly opened. As mentioned above, the transistor $Q_{16}$ receives through its base and from the constant-voltage biasing circuit 2 a biasing voltage of a voltage level which is smaller than either one of the two ECL signals having high and low levels that are applied to the base of the transistor $Q_{18}$. Accordingly, the transistor $Q_{16}$ is rendered non-conductive when predetermined signals are being supplied to the terminals $P_{11}$ and $P_{12}$. When the terminals $P_{11}$ and $P_{12}$ are opened, however, the transistors $Q_{17}$ and $Q_{18}$ receive no base current and are rendered non-conductive. Therefore, if the transistor $Q_{16}$ is not present, the collector voltages of the transistors $Q_{17}$ and $Q_{18}$ acquire the high level, whereby the transistors $Q_{21}$ and $Q_{23}$ are rendered conductive and are subject to be broken down. According to the embodiment of the present invention, however, the transistor $Q_{16}$ is commonly connected to the emitters of the transistors $Q_{17}$, $Q_{18}$, and constitutes a current switch together with the transistors $Q_{17}$, $Q_{18}$. Hence, the transistor $Q_{16}$ is rendered conductive when the transistors $Q_{17}$, $Q_{18}$ are rendered non-conductive. Consequently, a constant current of the constant-current transistor $Q_{19}$ flows through the resistor $R_{18}$ via the transistor $Q_{16}$. The transistors $Q_{20}$ and $Q_{21}$ are rendered non-conductive due to the voltage drop through the resistor $R_{18}$, whereby the signal of the output terminal $P_{14}$ acquires the high level.

According to the present invention as mentioned in the foregoing, the transistors in the driver are protected from being broken down, and the memory circuit is prevented from being erroneously operated when the power-supply voltages are undesirably changed.

What is claimed is:

1. A memory device comprising:
   memory circuit means including memory cells and means for accessing to desired memory cells; and
   driver means connected to said memory circuit means for driving said access means; wherein:
   said driver means comprises:
   emitter coupled logic means connected to first and second supply voltage for providing switch-on and switch-off signals in response to first and second input signals, respectively, wherein said first supply voltage is larger than said second supply voltage, said switch-on and switch-off signals lie between said second supply voltage and third supply voltage which lies between said first and second voltages, and said first and second input signals lie between said second and third supply voltages;
   switch means connected to said emitter coupled logic means for providing said access means with a drive signal of a low level in response to said switch-on signal and with a non-drive signal of a high level in response to said switch-off signal; and
   control means connected to said first to third supply voltages for clamping the output of said emitter coupled logic means to said non-drive signal when an operating point defined by said first and second supply voltages does not belong to a predetermined region, and wherein:
   said access means is means enabled in response to said drive signal.

2. A memory device according to claim 1, wherein said control means comprises:
   first control means connected to said first to third supply voltages for clamping the output of said emitter coupled logic means when said first supply voltage is larger than a first boundary value which changes in proportion to said second supply voltage; and
   second control means connected to said second and third supply voltages for clamping the output of said emitter coupled logic means when said second supply voltage is less than a second boundary value which is independent of said first supply voltage.

3. A memory device according to claim 2, wherein said first control means comprises:
   means connected to said first and second supply voltages, for generating a detection voltage which changes linearly with said first and second supply voltages; and
   clamp means connected to said third supply voltage and the output of said emitter coupled logic means, for clamping the output of said emitter coupled logic means to said third supply voltage when said detection voltage goes beyond a predetermined valve.

4. A memory device according to claim 2, wherein said second clamp means comprises:
   means connected to said second and third supply voltages, for generating a detection voltage when a difference between said third and second supply voltages goes beyond a predetermined value; and
   means connected to said third supply voltage and the output of said emitter coupled logic means, for clamping the output of said emitter coupled logic means to said third supply voltage when said detection voltage goes beyond a predetermined value.

5. A memory device according to claim 1, wherein said switch means comprises first and second transistors mutually connected in a push-pull connection between said first and third supply voltages, said first transistor becoming conductive in response to said switch-off signal and said second transistor becoming conductive in response to said switch-on signal, respectively, said switch means providing a voltage of a connecting point of said first and second transistors to said access means as said drive signal and said non-drive signal.

6. A memory device according to claim 5, wherein said emitter logic means comprises third and fourth transistors, wherein:
   emitters of said third and fourth transistors are commonly connected to current source means;
   collectors of said third and fourth transistors are connected to said first supply voltage by way of first and second transistors, respectively, and are further connected to bases of said first and second transistors, respectively; and
   bases of said third and fourth transistors are responsive to said first and second input signals, respectively.

7. A memory device according to claim 6, wherein said control means comprises:
   a third and fourth resistances series connected between said first and second supply voltages;
   a fifth transistors, an emitter thereof being connected to a connecting point of said third and fourth resistances, and a collector thereof being connected to said first supply voltage;
   a sixth transistor, a collector thereof being connected to said collector of said fourth transistor and an emitter thereof being connected to said third supply voltage, and a base thereof being responsive to a voltage of a collector of said fifth transistor;
   voltage supply means interposed between said second and third supply voltage for providing a first voltage dependent on said second and third voltage;
   a sixth transistor, a collector thereof being connected to said first voltage by way of a fifth resistance, an emitter thereof being connected to said second supply voltage, and a base thereof being responsive to said first voltage provided by said voltage supply means; and
   a seventh transistor, a collector thereof being connected to said collector of said fourth transistor, an emitter thereof being connected to said third supply voltage, and a base thereof being connected to said collector of said sixth transistor.

8. A memory device according to claim 7, wherein: said current source means comprises a ninth transistor, a collector thereof being connected to said emitters of said third and fourth transistors, and an emitter thereof being connected to said second supply voltage by way of a fifth resistance; and said voltage supply means comprises means for providing a second voltage being higher than said first voltage and being dependent on said second and third supply voltage to a base of said ninth transistor.

9. A memory device according to claim 8, further comprising a tenth transistor, a collector thereof being connected to said collector of said fourth transistor and, an emitter thereof being connected to said emitters of said third and fourth transistors, for lowering a collector voltage of said fourth transistor when said bases of said third and fourth transistors are isolated from said first and second input signals, respectively.

* * * * *